(12) United States Patent
Bolotnikov et al.

(10) Patent No.: US 9,748,341 B2
(45) Date of Patent: Aug. 29, 2017

(54) METAL-OXIDE-SEMICONDUCTOR (MOS) DEVICES WITH INCREASED CHANNEL PERIPHERY

(71) Applicant: General Electric Company, Schenectady, NY (US)

(72) Inventors: Alexander Viktorovich Bolotnikov, Niskayuna, NY (US); Peter Almern Losee, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 47 days.

(21) Appl. No.: 13/934,004

(22) Filed: Jul. 2, 2013

(65) Prior Publication Data

US 2015/0008448 A1    Jan. 8, 2015

(51) Int. Cl.

| H01L 29/15 | (2006.01) |
|---|---|
| H01L 29/66 | (2006.01) |
| H01L 29/02 | (2006.01) |
| H01L 23/58 | (2006.01) |
| H01L 29/16 | (2006.01) |
| H01L 29/417 | (2006.01) |
| H01L 29/78 | (2006.01) |

(52) U.S. Cl.
CPC .... H01L 29/1608 (2013.01); H01L 29/41758 (2013.01); H01L 29/66068 (2013.01); H01L 29/7802 (2013.01)

(58) Field of Classification Search
CPC . H01L 29/15; H01L 31/0312; H01L 29/1608; H01L 29/41758; H01L 29/66068; H01L 29/7802

USPC .......... 257/77, 337, 341, 343, 401, 496, 49, 257/E29.061, E29.201, 586; 438/163, 438/282, 330, 334, 424, 576, 197

See application file for complete search history.

(56) References Cited

U.S. PATENT DOCUMENTS

| 4,393,391 A | 7/1983 | Blanchard |
|---|---|---|
| 5,119,153 A * | 6/1992 | Korman ............ H01L 29/66333 257/341 |
| 5,174,857 A | 12/1992 | Sung |
| 5,506,421 A * | 4/1996 | Palmour ......................... 257/77 |
| 5,530,272 A | 6/1996 | Kudo et al. |
| 5,541,430 A * | 7/1996 | Terashima .......... H01L 29/4236 257/130 |

(Continued)

FOREIGN PATENT DOCUMENTS

| EP | 2091083 A2 | 8/2009 |
|---|---|---|
| WO | 2012108166 A1 | 8/2012 |
| WO | 2012108167 A1 | 8/2012 |

OTHER PUBLICATIONS

Nakao, H. et al., Characterization of 4H-SiC MOSFETs Formed on the Different Trench Sidewalls, Materials Science Forum vols. 527-529, 2006, pp. 1293-1296, Trans Tech Publications, Switzerland.

(Continued)

*Primary Examiner* — Dzung Tran
(74) *Attorney, Agent, or Firm* — Pabitra K. Chakrabarti

(57) ABSTRACT

A semiconductor device includes a drift layer disposed on a substrate. The drift layer has a non-planar surface having a plurality of repeating features oriented parallel to a length of a channel of the semiconductor device. Further, each the repeating features have a dopant concentration higher than a remainder of the drift layer.

16 Claims, 7 Drawing Sheets

(56) References Cited

U.S. PATENT DOCUMENTS

| | | | |
|---|---|---|---|
| 5,708,286 A | 1/1998 | Uesugi et al. | |
| 5,893,757 A | 4/1999 | Su et al. | |
| 5,897,343 A * | 4/1999 | Mathew | H01L 29/7813 |
| | | | 257/E29.027 |
| 5,917,216 A | 6/1999 | Floyd et al. | |
| 6,013,551 A * | 1/2000 | Chen et al. | 438/264 |
| 6,046,473 A | 4/2000 | Blanchard | |
| 6,049,108 A | 4/2000 | Williams et al. | |
| 6,144,067 A | 11/2000 | Kinzer | |
| 6,218,701 B1 | 4/2001 | Semple et al. | |
| 6,448,139 B2 | 9/2002 | Ito et al. | |
| 6,495,863 B2 * | 12/2002 | Narazaki | H01L 27/0255 |
| | | | 257/106 |
| 6,841,436 B2 | 1/2005 | Hisada et al. | |
| 7,157,770 B2 | 1/2007 | Park et al. | |
| 7,655,514 B2 | 2/2010 | Zhang et al. | |
| 7,732,861 B2 | 6/2010 | Tsuji | |
| 8,153,484 B2 | 4/2012 | Shibib et al. | |
| 8,211,770 B2 | 7/2012 | Zhang et al. | |
| 2001/0040273 A1 * | 11/2001 | Hueting et al. | 257/623 |
| 2005/0023569 A1 * | 2/2005 | Yang | H01L 29/78 |
| | | | 257/213 |
| 2006/0038182 A1 * | 2/2006 | Rogers | B82Y 10/00 |
| | | | 257/77 |
| 2006/0255412 A1 | 11/2006 | Ramaswamy et al. | |
| 2008/0119034 A1 * | 5/2008 | Smirnov | H01L 21/306 |
| | | | 438/606 |
| 2008/0217625 A1 * | 9/2008 | Kuroda | H01L 29/045 |
| | | | 257/76 |
| 2010/0207172 A1 * | 8/2010 | Masuoka et al. | 257/255 |
| 2010/0301335 A1 * | 12/2010 | Ryu et al. | 257/49 |
| 2011/0266557 A1 * | 11/2011 | Mieczkowski | H01L 29/42316 |
| | | | 257/77 |
| 2012/0313112 A1 | 12/2012 | Wada et al. | |
| 2013/0008497 A1 * | 1/2013 | Smirnov | B82Y 30/00 |
| | | | 136/256 |
| 2013/0306986 A1 * | 11/2013 | Wada et al. | 257/77 |

OTHER PUBLICATIONS

Henke, W. et al., "Simulation and Experimental Study of Gray-Tone Lithography for the Fabrication of Arbitrarily Shaped Surfaces," Proc. IEEE Micro Electro Mechanical Syst. MEMS 1994, Oiso, Japan, pp. 205-210.

Fujisawa, Hiroyuki, et al., The Characteristics of MOSFETs Fabricated on the Trench Sidewalls of Various Faces Using 4H-SiC (11-20) Substrates, Materials Science Forum vols. 527-529, 2006, pp. 1297-1300, Trans Tech Publications, Switzerland.

Unofficial English Translation of Chinese Office Action issued in connection with corresponding CN Application No. 201410310922.2 on Sep. 1, 2016.

Combined Search and Examination Report issued in connection with corresponding GB Application No. GB1411795.6 dated Jan. 7, 2015.

* cited by examiner

METAL-OXIDE-SEMICONDUCTOR (MOS) DEVICES WITH INCREASED CHANNEL PERIPHERY

BACKGROUND

The subject matter disclosed herein relates to metal-oxide-semiconductor (MOS) controlled devices, such as power devices (e.g., MOSFETs, IGBTs, IBTs, ESTs, etc.).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Power electronics systems are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), junction gate field-effect transistor (JFETs), insulated gate bipolar transistors (IGBTs), and other suitable transistors), in this power conversion process.

Specifically for high-voltage and/or high-current applications, devices utilizing wide bandgap semiconductors, such as silicon carbide (SiC), aluminum nitride (AlN), gallium nitride (GaN), etc., afford a number of advantages in terms of high temperature operation, reduced ON-resistance, and smaller die size than corresponding silicon (Si) devices. Accordingly, wide bandgap semiconductor devices offer advantages to electrical conversion applications including, for example, power distribution systems (e.g., in electrical grids), power generation systems (e.g., in solar and wind converters), as well as consumer goods (e.g., electric vehicles, appliances, power supplies, etc.). However, the differences between SiC and Si material systems, for example, can cause certain material processing and structural features (e.g., device designs and/or manufacturing processes) that work well for Si devices to be unsuitable for corresponding SiC semiconductor devices, and vice versa. Accordingly, in addition to their benefits, wide-bandgap semiconductors materials also present challenges during device design and fabrication.

BRIEF DESCRIPTION

Certain embodiments commensurate in scope with the originally claimed subject matter are summarized below. These embodiments are not intended to limit the scope of the claimed invention, but rather these embodiments are intended only to provide a brief summary of possible forms of the invention. Indeed, the present disclosure may encompass a variety of forms that may be similar to or different from the embodiments set forth below.

In an embodiment, a semiconductor device includes a drift layer disposed on a substrate. The drift layer has a non-planar surface having a plurality of repeating features oriented parallel to a length of a channel of the semiconductor device. Further, each of the repeating features have dopant concentration higher than a remainder of the drift layer.

In another embodiment, a method of manufacturing a semiconductor device includes forming an epitaxial semiconductor layer having a non-planar surface, wherein the non-planar surface may include repeating triangular, rectangular, rounded features, or other suitable repeating features, having a higher doping than a remainder of the epitaxial semiconductor layer. The method includes forming a non-planar well region from at least a portion of the non-planar surface of the epitaxial semiconductor layer and forming a non-planar n+ or p+ region from at least a portion of the non-planar well region.

In another embodiment, a semiconductor device includes a drift layer having a thickness, wherein the drift layer has a non-planar surface with a plurality of trench features extending a depth into the drift layer. The depth is less than or equal to approximately 10% of the thickness of the drift layer. The device includes a non-planar p-well region conformally disposed in at least a portion of the non-planar surface of the drift layer and a non-planar n+ region conformally disposed in at least a portion of the non-planar p-well region. The device also includes a non-planar dielectric layer conformally disposed over at least a portion of the drift layer, a portion of the p-well region, and a portion of the n+ region. The device further includes a non-planar gate conformally disposed over at least a portion of the non-planar dielectric layer.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
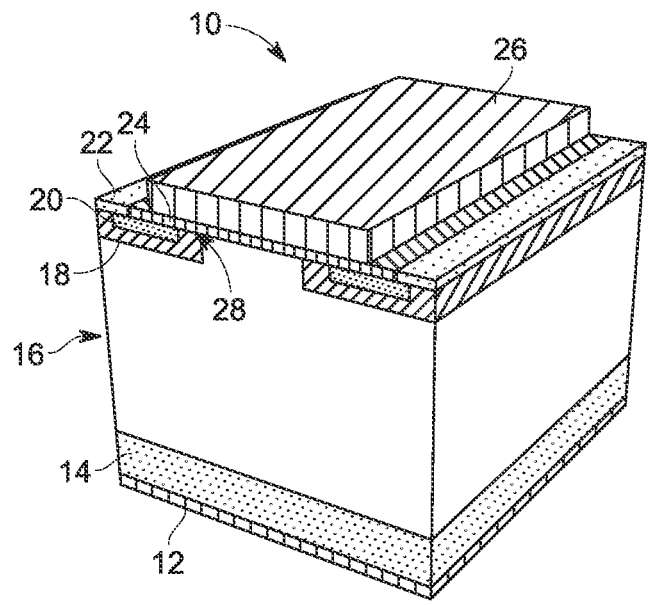
FIG. 1 is a schematic of a typical planar MOSFET device.

One of the essential building blocks of modern power electronics is the field-effect transistor (FET) device. For example, FIG. 1 illustrates an active cell of a planar n-channel field-effect transistor, namely a double-diffused metal-oxide-semiconductor field-effect transistor (DMOSFET), hereinafter MOSFET device 10. It may be appreciated that, in order to more clearly illustrate certain components of the MOSFET device 10, as well as other devices discussed below, certain commonly understood design elements (e.g., top metallization, passivation, edge termination, and so forth) may be omitted. The illustrated MOSFET device 10 of FIG. 1 includes a drain contact 12 disposed on the bottom of the device, below an n-type substrate layer 14. Above the substrate layer 14, an n-type drift layer 16 is disposed. Near the surface of the MOSFET device 10, p-well 18 (e.g., well region 18) and an n+ region 20 are situated below a source contact 22. Further, a dielectric layer 24 isolates a gate 26 from the n+ region 20 and the p-well 18. During operation, an appropriate gate voltage (e.g., at or beyond a threshold voltage of the MOSFET device 10) may cause an inversion layer to form in the channel region 28, which may allow current to flow between the source contact 22 and the drain contact 12. It should be appreciated that the channel region 28 may be generally defined by the interface between the p-well region 18 and the gate dielectric 24 for MOSFET devices. Accordingly, the width or periphery of the channel region 28 may be proportional to the surface area of the MOSFET device, as discussed further below.

Figure 2:
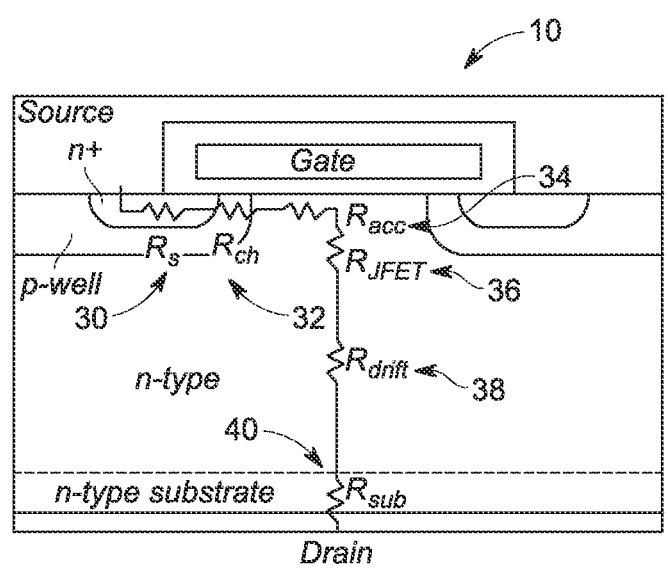
FIG. 2 is a schematic illustrating resistances for various regions of a typical MOSFET device.

As illustrated in FIG. 2, the various regions of the MOSFET device 10 may each have an associated resistance, and a total resistance (e.g., an on-state resistance, $R_{ds}(on)$) of the MOSFET device 10 may be represented as a sum of each of these resistances. For example, as illustrated in FIG. 2, on-state resistance, $R_{ds}(on)$, of the MOSFET device 10 may be approximated as a sum of: a resistance $R_s$ 30 (e.g., a resistance of n+ region 20 and a resistance of the source contact 22); a resistance $R_{ch}$ 32 (e.g., an inversion channel resistance of the well regions 18); a resistance $R_{acc}$ 34 (e.g., a resistance of an accumulation layer between the gate oxide 24 and portion of drift layer 16 located between well regions 18); a resistance $R_{JFET}$ 36 (e.g., resistance of neck region between well regions 18); a resistance $R_{drift}$ 38 (e.g., the resistance about the drift layer 16); and a resistance $R_{sub}$ 40 (e.g., the resistance about the substrate layer 14).

In order to reduce MOSFET conduction losses, it may be desirable to minimize the resistance (e.g., $R_{ds}(on)$) of one or more components of the MOSFET. If the channel resistance of the MOSFET is a significant portion of the total MOSFET resistance and/or the MOSFET suffers from low channel mobility, the on-state resistance (e.g., $R_{ds}(on)$) of a MOSFET device (e.g., the MOSFET 10 of FIG. 1) may become significant and affect device performance. As such, it may be desirable to design MOSFET devices such that the on-state resistance of the device is reduced. Further, it may be appreciated that some MOSFET devices (e.g., SiC MOSFET devices) generally have a lower inversion layer carrier mobility (e.g., a higher channel resistance, $R_{ch}$ 32) than similar silicon MOSFET devices. It may, therefore, be specifically desirable to design MOSFET devices (e.g., SiC MOSFET devices) with a lower on-state resistance by minimizing (e.g., reducing, limiting, or lessening) resistance of the channel component of the MOSFET. Further, as set forth above, SiC substrates can enable device manufacturing techniques that may be difficult to implement or unsuitable for Si substrates.

As such, presently disclosed are a number of systems (e.g., device structures) and methods for reducing on-state resistance in MOS-gated or/and MOS-controlled semiconductor devices (e.g., Metal Oxide Semiconductor Field Effect Transistor (MOSFETs), insulated gate bipolar transistors (IGBTs), Insulated Base MOS-Controlled Thyristor (IBMCT), Base Resistance MOS-Controlled Thyristor (BRT), etc.). As discussed in detail below, present embodiments enable the manufacture of non-planar semiconductor devices with increased surface area and increased channel width (e.g., increased channel periphery), which enables the production of lower resistance devices. For example, as set forth below, presently disclosed embodiments include examples of semiconductor devices (e.g., SiC devices) that include repetitive trench features that provide, for example, a device profile resembling a sine wave, a triangular wave, a square wave, a sawtooth wave. The disclosed device embodiments provide an increased effective surface area per device (and per die) that, in addition to reducing channel resistance, decreases one or more contact resistances, and may also improve heat dissipation by increasing contact area of the semiconductor devices. Further, as discussed in detail below, this approach may also be applicable to cellular device designs (e.g., SiC cellular device designs), such as square or honeycomb structures, to further reduce channel resistance and/or reduce the total on-state resistance (e.g., $R_{ds}(on)$) of the device. It should be noted that, while the device embodiments discussed below are presented as SiC devices, these are merely provided as examples. In other embodiments, semiconductor devices may be manufactured from silicon (Si), germanium (Ge), aluminum nitride (AlN), gallium nitride (GaN), gallium arsenide (GaAs), diamond (C), or any other semiconductor material without negating the effect of the present approach.

Figure 3:
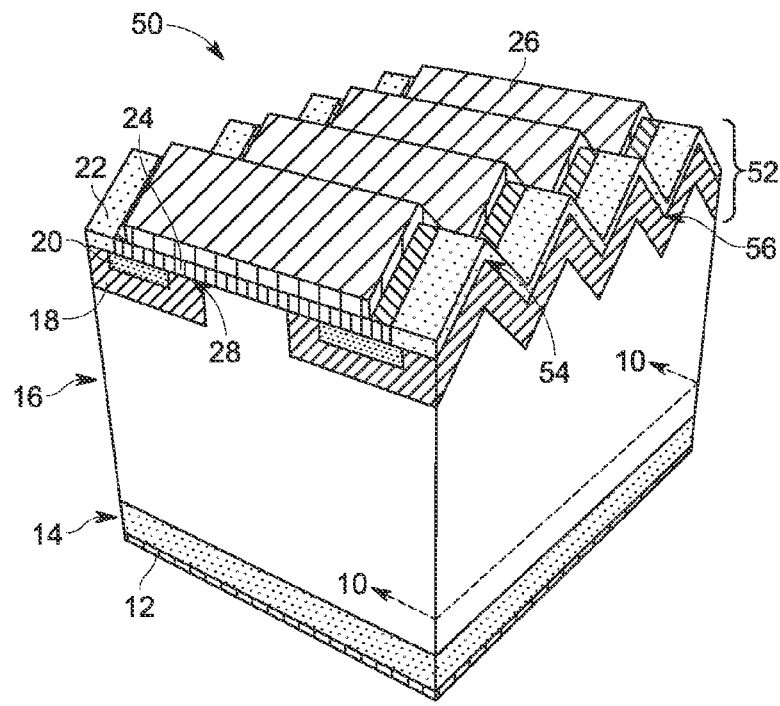
FIG. 3 is a schematic of a vertical non-planar MOSFET device having a triangular wave device profile, in accordance with an embodiment of the present approach.

With the foregoing in mind, FIG. 3 is a schematic of an embodiment of a non-planar SiC n-channel DMOSFET device 50, hereinafter MOSFET device 50. Like the MOSFET device 10 of FIG. 1, the MOSFET device 50 of FIG. 3 includes a drain contact 12 disposed on the bottom of the device, below an n-type substrate layer 14. Above the substrate layer 14, an n-type drift layer 16 (e.g., an epitaxial SiC layer) is disposed. Near the surface of the MOSFET device 50, a well region 18 (e.g., p-well 18) and an n+ region 20 are situated below the source contact 22. Further, a dielectric layer 24 isolates the gate 26 from the n+ region 20 and the p-well 18. While the illustrated MOSFET device 50, and other MOSFET devices discussed below, are illustrated and described as having particular doping (e.g., the p-well 18 and the n+ region 20), in other embodiments, the various layers of the MOSFET device may be doped in an opposite fashion (e.g., utilizing an n-well and a p+ region), as may be appreciated by those of skill in the art.

Unlike the MOSFET device 10 of FIG. 1, in which the device is fabricated on a planar surface, the surface profile 52 the MOSFET device 50 illustrated in FIG. 3 is shaped like a triangular wave, with repeating peak features 54 and trench features 56. Accordingly, the surface of the drift layer 16, the p-well 18, the n+ region 20, the source contact 22, the gate dielectric 24, and the gate 26 may each demonstrate this triangular wave shape (e.g., with repeating peak 54 and trench 56 features). Moreover, the channel region 28 of the MOSFET 50 (e.g., oriented parallel to the repeating peak and trench features 54 and 56) may similarly demonstrate this triangular wave shape, resulting in a channel region 28 that, due to the repeating peak 54 and trench 56 features, has an increased channel width (e.g., an increased channel periphery). As set forth above, this increased width of the channel region 28 in MOSFET device 50 may reduce one or more individual resistances (e.g., channel resistance and/or contact resistance between the source and n+ regions 18) of the MOSFET device 50 and, thereby, reduce the on-state resistance (e.g., $R_{ds}$(on)) of the MOSFET device 50.

Figure 4:
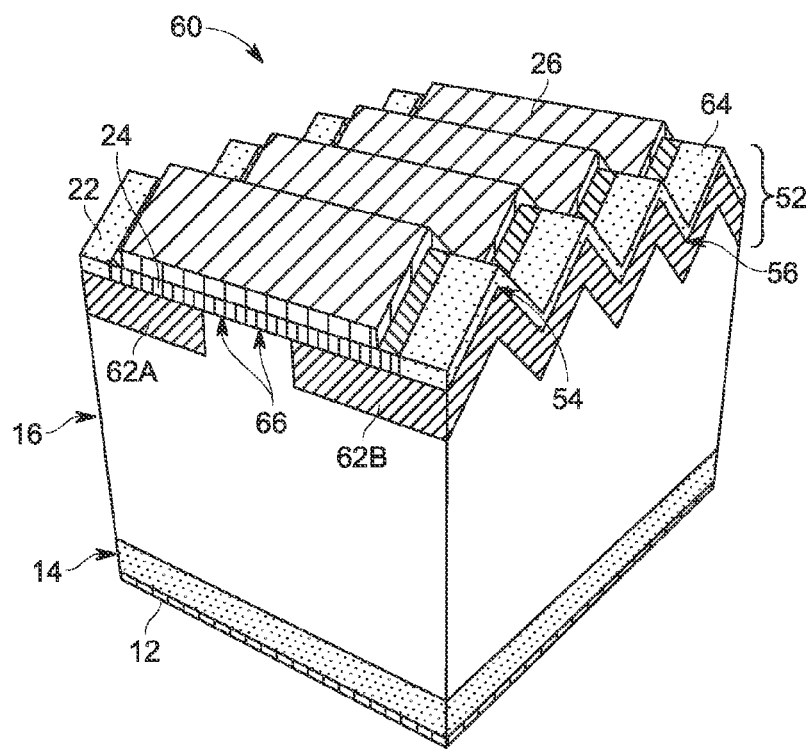
FIG. 4 is a schematic of a non-planar lateral MOSFET device having a triangular wave device profile, in accordance with an embodiment of the present approach.

Similarly, FIG. 4 is a schematic of another embodiment of a non-planar SiC lateral MOSFET device 60, hereinafter LMOSFET device 60. Like the MOSFET device 50 of FIG. 3, the n-channel LMOSFET device 60 of FIG. 4 includes an n- or p-type substrate layer 14 above which an p-type drift layer 16 is disposed. Near the surface of the LMOSFET device 60, a first n-well 62A is situated below the source contact 22 while a second n-well 62B is disposed below the drain contact 64. Further, a dielectric layer 24 isolates the gate 26 from the n-wells 62A and 62B. During operation of the illustrated LMOSFET device 60, an applied gate voltage that exceeds a device threshold voltage would cause the formation of a conductive channel (e.g., an inversion layer) in the channel region 66 (e.g., at the interface between the drift layer 16 and the gate oxide 24) to enable a lateral flow of charge carriers between the source contact 22 and the drain contact 64.

Similar to the MOSFET device 50 of FIG. 3, the surface profile 52 for the LMOSFET device 60 illustrated in FIG. 4 is shaped like a triangular wave, with repeating peak features 54 and trench features 56. Accordingly, the surface of the drift layer 16, the n-wells 62A and 62B, the source contact 22, the gate dielectric 24, the gate 26, and the drain contact 64 may each demonstrate this triangular wave shape (e.g., with repeating peak 54 and trench 56 features). Moreover, the channel region 66 of the LMOSFET 60 (e.g., oriented parallel to the repeating peak and trench features 54 and 56) may similarly demonstrate this triangular wave shape, resulting in a channel region 66 that, due to the repeating peak 54 and trench 56 features, has an increased channel width (e.g., an increased channel periphery). As set forth above, this increased width of the channel region 66 in LMOSFET 60 may reduce one or more individual resistances (e.g., channel resistance and/or contact resistance between the source/drain and n+ regions 18) of the LMOSFET device 60 and, thereby, reduce the total on-state resistance of the LMOSFET device 60.

Figure 5:
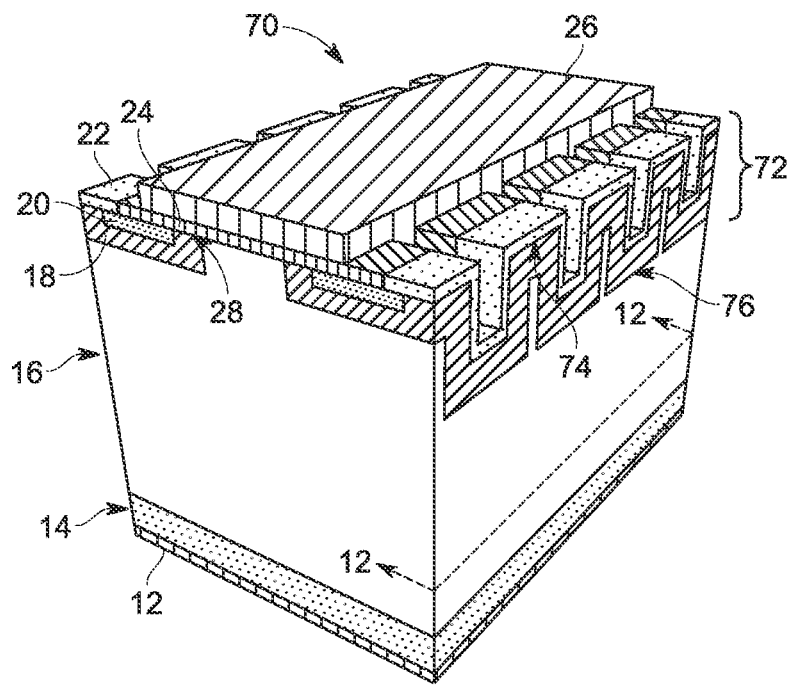
FIG. 5 is a schematic of a non-planar MOSFET device having a square wave device profile, in accordance with an embodiment of the present approach.
Figure 6:
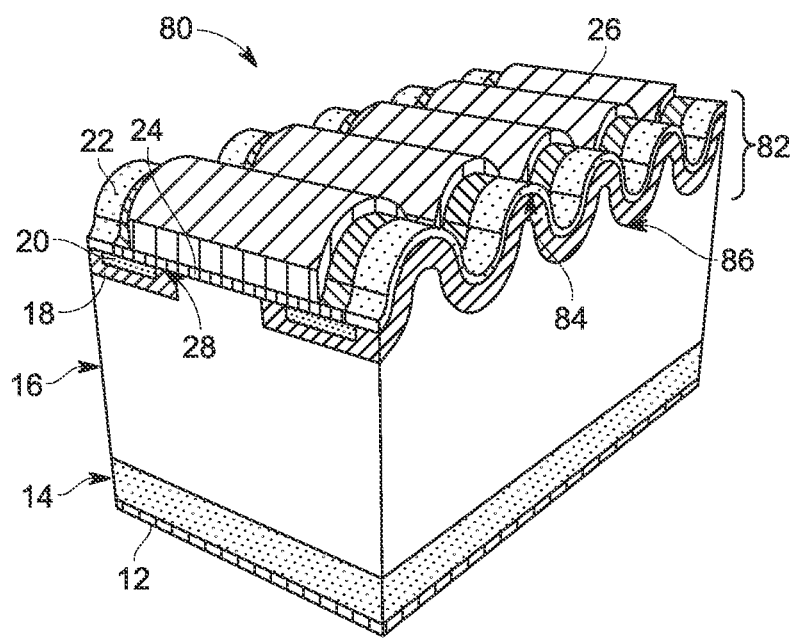
FIG. 6 is a schematic of a non-planar MOSFET device having a sine wave device profile, in accordance with an embodiment of the present approach.

FIGS. 5 and 6 are schematics of embodiments of MOSFET devices having non-planar geometries. In particular, FIG. 5 illustrates a SiC DMOSFET device 70, hereinafter MOSFET device 70, having a device profile 72 resembling a square wave having repeating rectangular peak features 74 and rectangular trenches features 76. FIG. 6 illustrates a SiC DMOSFET device 80, hereinafter MOSFET device 80, having a device profile 82 resembling a sine wave having repeating rounded peak features 84 and rounded trench features 86. It may be appreciated that the disclosed device profiles (e.g., device profiles 52, 72, and 82) are merely provided as examples of non-planar profiles and are not intended to be limiting. Further, it may be appreciated that the MOSFET devices 70 and 80 that are respectively illustrated in FIGS. 5 and 6 may include a number of corresponding device features (e.g., drain contact 12, n-type substrate 14, n-type drift layer 16, p-well 18, n+ region 20, source contact 22, dielectric layer 24, and gate 26) as set forth above for the MOSFET device 10 of FIG. 1.

The square-wave surface profile 72 the MOSFET device 70 illustrated in FIG. 5 imparts a similar square-wave shape (e.g., with repeating peak features 74 and trench features 72) to the surface of the drift layer 16, the p-well 18, the n+ region 20, the source contact 22, the gate dielectric 24, and the gate 26. Similarly, the sine wave surface profile 82 the MOSFET device 80 illustrated in FIG. 6 is imparts a sine wave shape (e.g., with repeating peak features 84 and trench features 86) to the surface of the drift layer 16, the p-well 18, the n+ region 20, the source contact 22, the gate dielectric 24, and the gate 26. Moreover, the channel regions 28 of the MOSFET devices 70 and 80 (e.g., oriented parallel to the repeating peak features 74 and 84 and to the repeating trench features 76 and 86, respectively) may have an increased channel width (e.g., an increased channel periphery) relative to a planar device due to the repeating peak features (e.g., rectangular peak features 74 or rounded peak features 84) and trench features (e.g., rectangular trench features 76 or rounded trench features 86). As set forth above, this increased width of the channel region 28 in MOSFET devices 70 and 80 may reduce one or more individual resistances (e.g., channel resistance and/or contact resistance between the source and n+ regions 18) of the MOSFET devices 70 and 80 and, thereby, reduce the on-state resistances of the respective devices.

It should be appreciated that conventional semiconductor fabrication techniques (e.g., photolithography, ion implantation, annealing, chemical vapor deposition (CVD), dielectric deposition, gate metal deposition, ohmic contact formation, and so forth) may be used to fabricate a non-planar SiC MOSFET device (e.g., MOSFET devices 50, 60, 70, and 80 of FIGS. 3-6). For example, in certain embodiments, a non-planar SiC surface (e.g., having a triangular wave profile 52 illustrated in FIGS. 3 and 4, having a square wave profile 72 illustrated in FIG. 5, or having a sine wave profile 82 illustrated in FIG. 6) may be formed by wet or dry etching through a lithographic mask. Thus, the shape of trenches may be controlled, for example, by etch chemistry/conditions, the mask material (e.g., a sloped resist mask for use with a sloped etching process or tapered profile etching method), and/or gray scale lithographic techniques.

Figure 7:
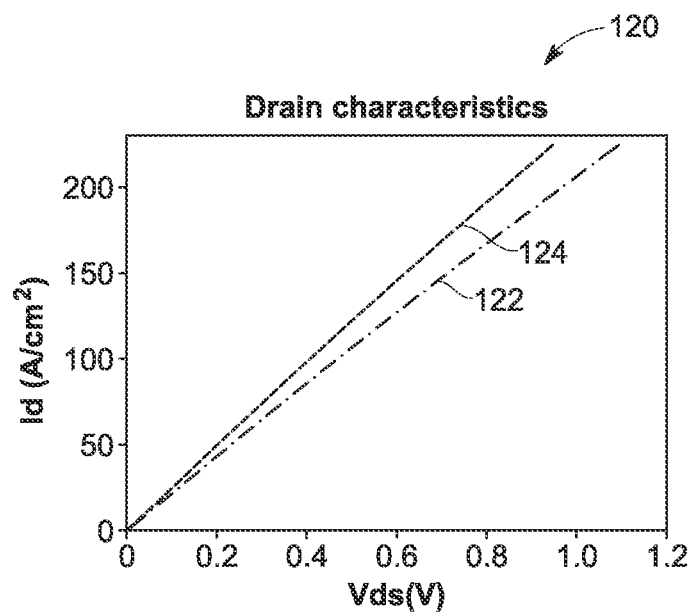
FIG. 7 is a graph illustrating drain characteristics for a planar SiC MOSFET device, an embodiment of a non-planar SiC MOSFET device.
Figure 8:
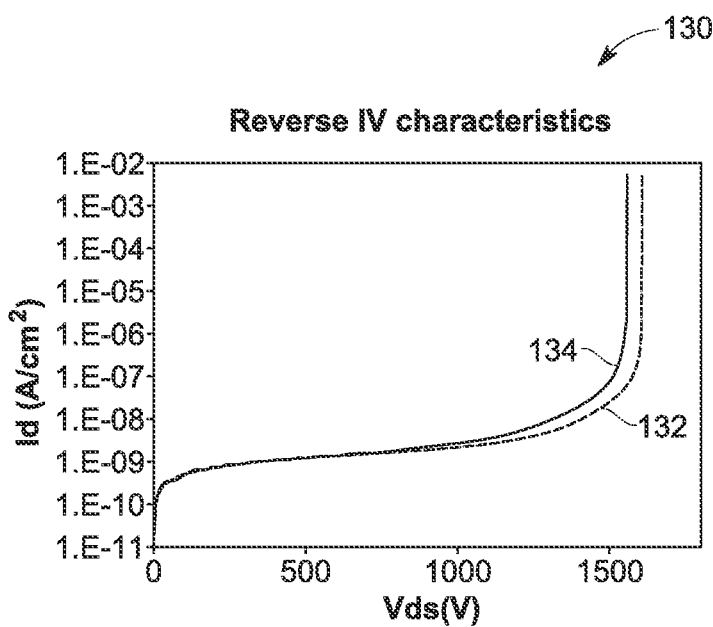
FIG. 8 is a graph illustrating reverse current-voltage (IV) characteristics for a planar MOSFET device and an embodiment of a non-planar MOSFET device.

FIGS. 7 and 8 demonstrate an example of characteristics of MOSFET devices manufactured using different geometries or orientations, as obtained by numerical simulation. The parameters of the simulation include: a SiC substrate, $8 \times 10^{16}$ cm$^{-3}$ drift layer doping, 1 µm trench depth, 2 µm trench pitch, 0.7 µm channel length, 15 cm$^2$/Vs inversion channel mobility. FIG. 7 is a graph 120 of the drain characteristics (e.g., drain current ($I_d$) versus source-drain voltage ($V_{ds}$) at a gate voltage of approximately 20V) of different MOSFET devices for comparison. As illustrated in graph 120, a planar MOSFET device (e.g., MOSFET device 10 of FIG. 1), represented by the line 122 has a slope less than that of the line 124, which represents a non-planar MOSFET device (e.g., MOSFET device 50 of FIG. 3). For example, the non-planar MOSFET device 50 of FIG. 3 provides a surface area approximately 1.4 times greater than that of the MOSFET device 10 of FIG. 1, which decreases the total on-state resistance, $R_{ds}$(on), of the non-planar MOSFET device by approximately 14%.

Additionally, FIG. 8 is a graph 130 of the reverse current-voltage (IV) characteristics (e.g., drain current ($I_d$) versus source-drain voltage ($V_{ds}$)) of different MOSFET devices for comparison. As illustrated in the graph 130, the curve 132, representing a planar MOSFET device (e.g., MOSFET device 10 of FIG. 1), demonstrates a lower current at certain voltages (e.g., at $V_{ds}$ greater than approximately 1500 V) than the curve 134, representing a non-planar MOSFET device (e.g., MOSFET device 50 of FIG. 3). Accordingly, the reverse IV characteristics illustrated in the graph 130 are generally indicative of a slight reduction (e.g., approximately 3%) in blocking capability for the non-planar MOSFET device (e.g., MOSFET device 50 of FIG. 3) compared to the planar MOSFET device (e.g., MOSFET device 10 of FIG. 1). It may be appreciated that, for certain situations, this reduction in blocking capability observed for certain non-planar MOSFET devices (e.g., MOSFET device 50 of FIG. 3) may preclude the use of such non-planar devices in certain applications. However, it may also be appreciated that, in certain embodiments, such as the MOSFET devices 70 and 80 of FIGS. 5 and 6, respectively, having a p-well 18 that lacks the sharp corners the peak features 54 and the trench features 56 illustrated in FIG. 3 may enable blocking capability comparable to planar MOSFET devices (e.g., MOSFET device 10 of FIG. 1).

Figure 9:
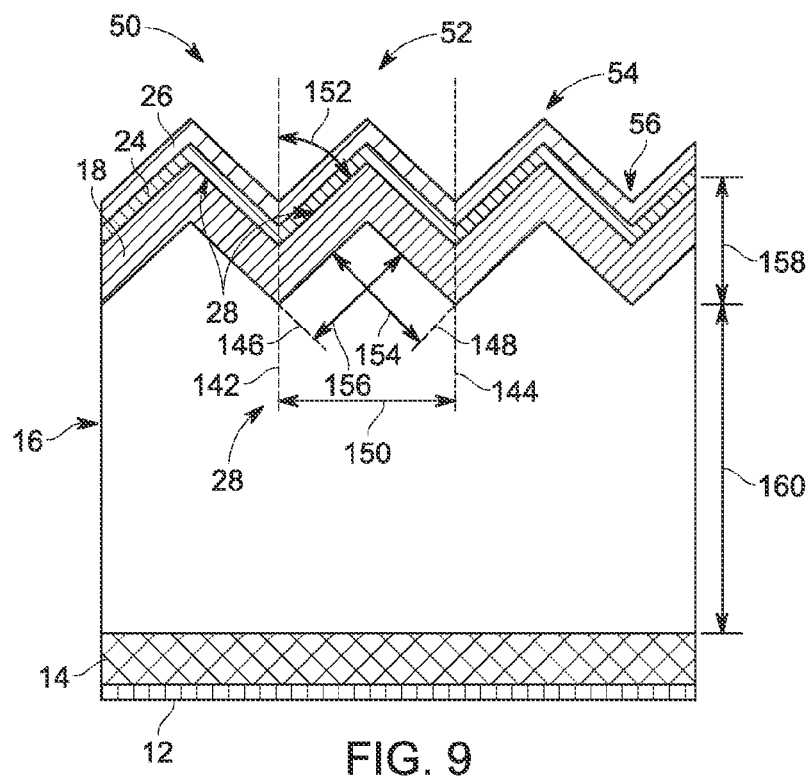
FIG. 9 is a cross-sectional view of the MOSFET device of FIG. 3, in accordance with an embodiment of the present approach.

With the foregoing in mind, FIG. 9 illustrates a cross-sectional view of MOSFET device 50 embodiment illustrated in FIG. 3, taken along line 10-10. Accordingly, the MOSFET device 50 illustrated in FIG. 9 includes features discussed above (e.g. drain contact 12, substrate 14, drift layer 16, p-well 18, n+ region (not shown), dielectric layer 24, and gate 26). Furthermore, FIG. 9 illustrates the triangular wave device profile 52, which includes the peaks 54 and the trenches 56. To facilitate discussion of various dimensions of the device profile 52, FIG. 9 includes dashed vertical lines 142 and 144, which are generally perpendicular relative to the bottom face or drain contact 12 of the MOSFET device 50. To further facilitate discussion, FIG. 9 also includes dotted lines 146 and 148 that each respectively track along and extend from a portion of the interface between the p-well 18 and the drift layer 16.

The dashed lines 142 and 144 illustrated in FIG. 9 define a distance 150, which may be referred to the wavelength or pitch of the triangular wave device profile 52. That is, over the distance 150 certain components of the MOSFET device 50 (e.g., the drift layer 16, the p-well region 18, the n+ region (not shown), the gate dielectric 24, and the gate 26) may transition through a full cycle from a trench feature 56 (e.g., a local minimum), through a peak feature 54 (e.g., a local maximum), and back to another trench feature 56. Additionally, FIG. 9 illustrates an angle 152 of the triangular wave device profile 52, which is illustrated as extending between the p-well 18 and the dashed vertical line 142. FIG. 9 also illustrates two distances 154 and 156, which respectively extend from dotted lines 146 and 148 to different points along the interface between the drift layer 16 and the p-well 18, and are generally indicative of the amplitude of the triangular wave device profile 52. While, in certain embodiments, the distances 154 and 156 may be the same, as illustrated in FIG. 9, in other embodiments, the distances 154 and 156 may be different. It may be appreciated that the particular shape of the triangular wave device profile 52 may depend, at least in part, on the distance 150, the angle 152, the distance 154, and/or the distance 156. It may also be appreciated that, compared to the planar MOSFET device 10 illustrated in FIG. 1, the MOSFET device 50 illustrated in FIG. 9 generally provides an increase in the periphery of the conduction channel (e.g., an increased width of the channel region 28) equivalent to approximately two times the distance 154 (or 156) divided by the distance 150 (e.g., the wavelength or pitch of the triangular wave device profile 52). Additionally, in certain embodiments, the MOSFET device 50 illustrated in FIG. 9 may have certain dimensions. For example, in certain embodiments, the distance 150 (e.g., the wavelength or pitch of the triangular wave device profile 52) may be greater than or equal to approximately twice the sum of a depth 158 of the trench features. It should be appreciated that the depth 158 of the trench features 56 generally corresponds to a height 158 of the intervening peak features 54 and, accordingly, trench depth and peak height may be used herein interchangeably.

In certain embodiments, the depth 158 of the trench features may be selected to provide the best compromise between on-state resistance (e.g., $R_{ds}$(on)) and blocking capability (e.g., blocking voltage (BV)). That is, if the depth 158 of the trench is sufficiently great, then trench features 56 may consume a substantial portion of the thickness 160 of the drift layer 16, which may impede the blocking capability of the MOSFET device 50. On the other hand, if the thickness 160 of the drift layer 16 is sufficiently large to accommodate deeper trench features 56 without impeding the blocking capability of the MOSFET device 50, the on-state resistance, $R_{ds}$(on), of the MOSFET device 50 may be greater due to the increased resistance of the thicker drift layer 16. As such, in certain embodiments, the depth 158 of the trench features 56 may be less than or equal to approximately 10% of the thickness 160 of the drift layer 16, which may provide suitably low on-state resistance (e.g., $R_{ds}$(on)) while maintaining suitable blocking capability. As an aside, it should also be noted that while the vertical MOSFET 50 may be implemented with particular dimensions and/or dopant concentrations, as discussed above and below, the LMOSFET 60 of FIG. 4 may, in certain embodiments, be implemented using a wider variety of dimensions (e.g., any reasonable trench depth 158) and/or dopant concentrations.

Figure 10:
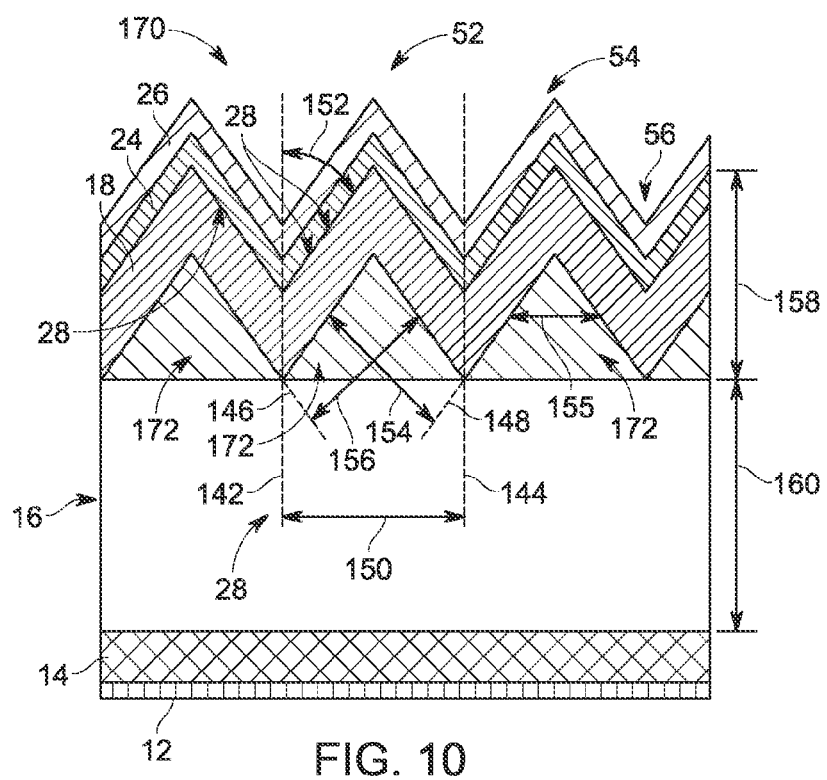
FIG. 10 is a cross-sectional view of an embodiment of the MOSFET device of FIG. 3 having deeper trench features and higher doping in the drift region between the trench features (e.g., compared to the doping of the drift layer below the p-/n-well)

As illustrated in FIG. 10, other approaches may be utilized to enable deeper trench features 56 (e.g., trench features 56 with greater depth 158). For example, FIG. 10 illustrates a MOSFET device 170, which is an embodiment of the MOSFET device 50 illustrated in FIG. 9 that has deeper trench features 56 (e.g., a greater value for the ratio of the depth 158 of the trench features 56 to the thickness 160 of the drift layer 16). Further, the MOSFET device 170 achieves these deeper trench features 56 without compromising between on-state resistance, $R_{ds}$(on), and blocking capability. For the illustrated embodiment, deeper trench features 56 are realized by fabricating a doped region 172 (e.g., using dopant implantation or epitaxial growth) within each peak feature 54 (e.g., between each trench feature 56) of the MOSFET device 170 prior to trench formation. It may be appreciated that the electric field shielding provided by the non-planar geometry (e.g., the triangular wave device profile 52 of the MOSFET device 170) may enable higher doping in the regions 172 (e.g., relative to the dopant concentration in the drift layer 16) without negatively affecting the blocking performance of the MOSFET device 170.

For example, in certain embodiments, the dopant concentration (e.g., in units of inverse cubic centimeters (1/cm³)) in the regions 172 may determined based on critical charge, $Q_{cr}$, which may be calculated the formula: $Q_{cr}=E_c*\in$; wherein $E_c$ is maximum electric field the semiconductor can withstand before breakdown, and wherein $\in$ is the absolute permittivity of semiconductor material (e.g. $1\times10^{13}$ cm$^{-2}$ for SiC). Accordingly, in certain embodiments, the dopant concentration may be less than or equal to approximately: twice the critical charge (e.g., $2Q_{cr}$) divided by the a distance 155 (e.g., the width of the peak features 54, the distance between well regions laying along the sidewalls of the peak features 54), as illustrated in FIG. 10. In certain embodiments, since distance 155 may vary with trench depth 158, the doping concentration, N, between the well regions may accordingly vary based on the relationship: $N<2Q_c/$(distance 155). Accordingly, it may be appreciated that, in certain embodiments, by utilizing the particular MOSFET device dimensions (e.g., distances 150, 154, 156, 158, 160, and angle 152) and doping (e.g., in the drift layer 16 and the doped regions 172) during fabrication, deeper trench features 56 may be achieved, which may enable reduced device resistance (e.g., decreased channel resistance) without sacrificing the blocking capability of the device.

Figure 11:
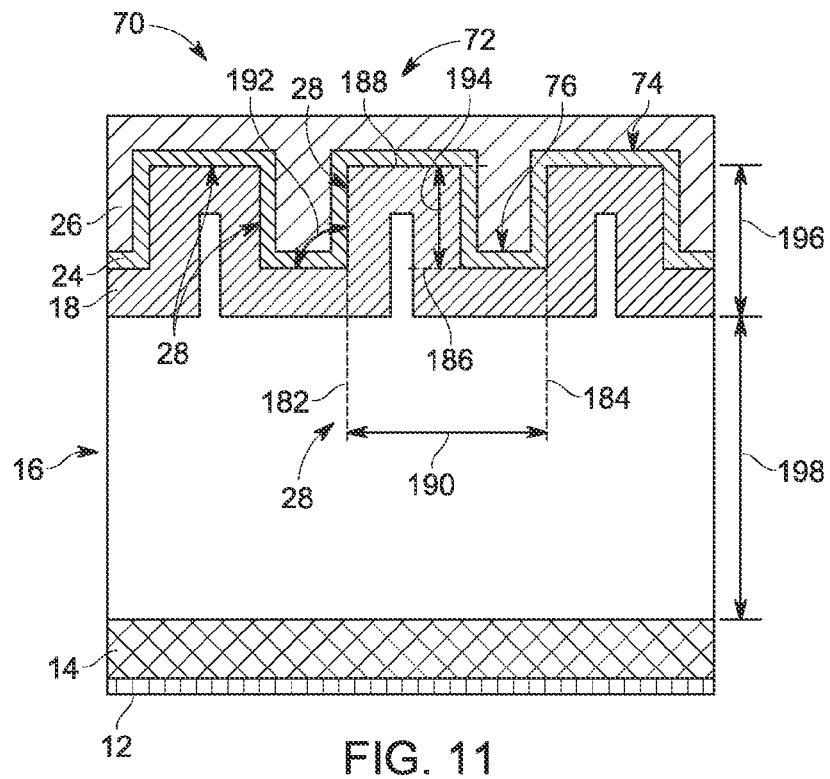
FIG. 11 is a cross-sectional view of the MOSFET device of FIG. 5, in accordance with an embodiment of the present approach.

FIG. 11 is a cross-sectional view of the MOSFET device 70 embodiment illustrated in FIG. 5, taken along line 12-12. Accordingly, the MOSFET device 70 illustrated in FIG. 11 includes features discussed above (e.g. drain contact 12, substrate 14, drift layer 16, p-well 18, n+ region (not shown), dielectric layer 24, and gate 26). Furthermore, FIG. 11 illustrates the square wave device profile 72, which includes the rectangular peaks 74 and the rectangular trenches 76. To facilitate discussion of various dimensions of the device profile 72, FIG. 11 includes dashed vertical lines 182 and 184, which are generally perpendicular relative to the bottom face or drain contact 12 of the MOSFET device 70. To further facilitate discussion, FIG. 11 also includes dotted vertical lines 186 and 188 (e.g., parallel to the bottom face or drain contact 12 of the MOSFET 70) that each respectively track along and extend from the horizontal interfaces between the p-well 18 and the dielectric layer 24.

The dashed lines 182 and 184 illustrated in FIG. 11 define a distance 190, which may be referred to as the pitch or wavelength of the square wave device profile 72. That is, over the distance 190 certain components of the MOSFET device 70 (e.g., the drift layer 16, the p-well region 18, the n+ region (not shown), the gate dielectric 24, and the gate 26) may transition through a full cycle from a peak feature 74 (e.g., a local maximum), through a trench feature 76 (e.g., a local minimum), and back to another peak feature 74. Additionally, FIG. 11 illustrates an angle 192 of the square wave device profile 72, which is illustrated as extending between the p-well 18 and the dashed vertical line 142, and may be approximately 90°. It may be appreciated that, in certain embodiments, the angle 192 may be larger than 90°, providing a trapezoidal trench design. FIG. 11 also illustrates a distance 194, which extends between dotted lines 186 and 188 and is generally indicative of the trench depth for the square wave device profile 72. It should be appreciated that the depth 194 of the trench features 76 generally corresponds to a height 194 of the intervening peak features 74 and, accordingly, trench depth and peak height may be used herein interchangeably. It may be appreciated that the particular shape of the square wave device profile 72 may depend, at least in part, on the distance 190, the angle 192, and/or the distance 194. It may also be appreciated that, compared to the planar MOSFET device 10 illustrated in FIG. 1, the MOSFET device 70 illustrated in FIG. 11 generally provides an increase in the periphery of the conduction channel (e.g., an increased width of the channel region 28) of approximately: (2a+b)/b, wherein a is the distance 194 and b is the distance 190.

Additionally, in certain embodiments, the MOSFET device 70 illustrated in FIG. 11 may have certain dimensions. For example, in certain embodiments, the distance 190 (e.g., the wavelength or pitch of the square wave device profile 72) may be greater than or equal to approximately twice the sum of the depth 196 of the p-well 18 and the depletion region.

In certain embodiments, the trench depth 194 may be selected to provide the best compromise between on-state resistance, $R_{ds}$(on), and blocking capability. That is, if the trench depth 194 is sufficiently great, then trench features 76 may consume a substantial portion of the thickness 198 of the drift layer 16, which may impede the blocking capability (e.g., BV) of the MOSFET device 70. On the other hand, if the thickness 198 of the drift layer 16 is sufficiently large to accommodate a deeper p-well 18 without impeding the blocking capability of the MOSFET device 70, the on-state resistance, $R_{ds}$(on), of the MOSFET device 70 may be greater due to the increased resistance of the thicker drift layer 16. As such, in certain embodiments, the depth 196 of the p-well 18 may be less than or equal to approximately 10% of the thickness 198 of the drift layer 16, which may provide suitably low on-state resistance while maintaining suitable blocking capability.

Figure 12:
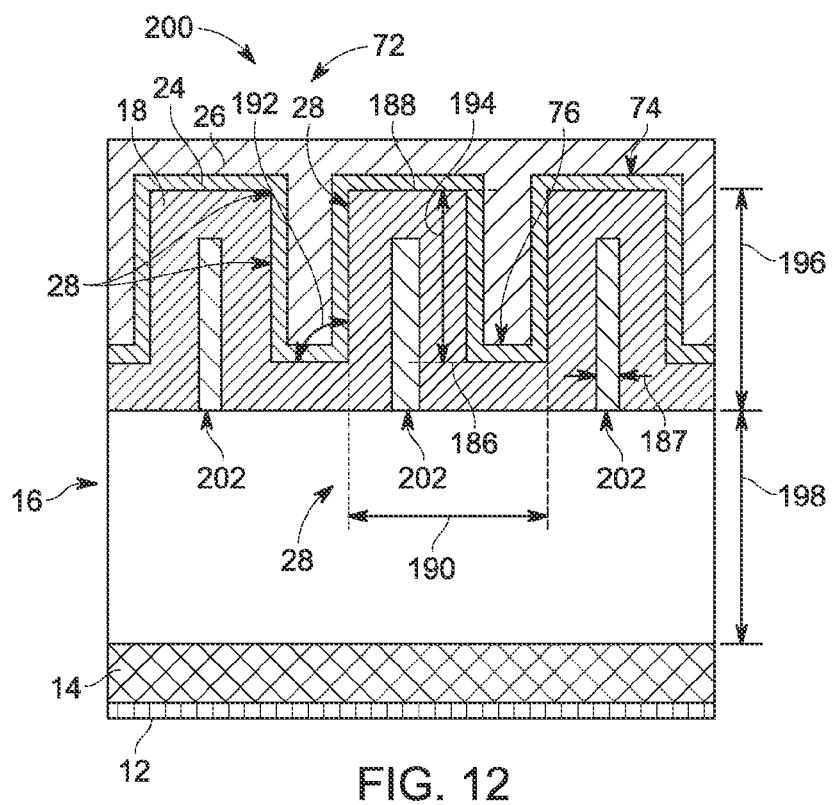
FIG. 12 is a cross-sectional view of an embodiment of the MOSFET device of FIG. 5 having deeper trench features and higher doping in the drift region between the trench features (e.g., compared to the doping of the drift layer below the p-/n-well)

As illustrated in FIG. 12, other approaches may be utilized to enable deeper rectangular trench features 76 (e.g., p-wells 18 with greater depth 196). For example, FIG. 12 illustrates a MOSFET device 200, which is an embodiment of the MOSFET device 70 illustrated in FIG. 11 that has deeper rectangular trench features 76 (e.g., a greater value for the ratio of the depth 196 of the p-well to the thickness 198 of the drift layer 16). Further, the MOSFET device 200 achieves these deeper trench features 76 without compromising between on-state resistance and blocking capability. That is, for the illustrated embodiment, the deeper trench features 76 (e.g., a p-well 18 that extends deeper into the drift layer 16) are realized by fabricating a doped region 202 within each rectangular peak feature 74 (e.g., between each rectangular trench feature 76) of the MOSFET device 200 (e.g., prior to trench formation). It may be appreciated that the electric field shielding provided by the non-planar geometry (e.g., the square wave device profile 72 of the MOSFET device 200) may enable higher doping in the regions 202 (relative to the dopant concentration in the drift layer 16) without negatively affecting the performance of the MOSFET device 200. For example, in certain embodiments, the dopant concentration (e.g., in units per cubic centimeter (cm$^{-3}$)) in the regions 202 may be determined based on critical charge, $Q_{cr}$, which may be calculated the formula: $Q_{cr}=E_c*\epsilon$; wherein $E_c$ is maximum electric field the semiconductor can withstand before breakdown, and wherein c is absolute permittivity of semiconductor material (e.g., $2\times10^{13}$ cm$^{-2}$ for SiC). Accordingly, in certain embodiments, the dopant concentration may be less than or equal to approximately: twice the critical charge (e.g., $2Q_{cr}$) divided by the a distance 187 (e.g., the width of the peak features 74, the distance between the well regions laying on the sidewalls of the peak features 74), as illustrated in FIG. 11. Accordingly, it may be appreciated that, in certain embodiments, by utilizing the particular MOSFET device dimensions (e.g., distances 190, 194, 196, 198, and angle 192) and doping (e.g., in the drift layer 16 and the doped regions 202) during fabrication, deeper rectangular trench features 76 may be achieved, which may enable reduced device resistance (e.g., increase channel mobility, reduced on-state resistance) without sacrificing the blocking capability of the device.

Figure 13:
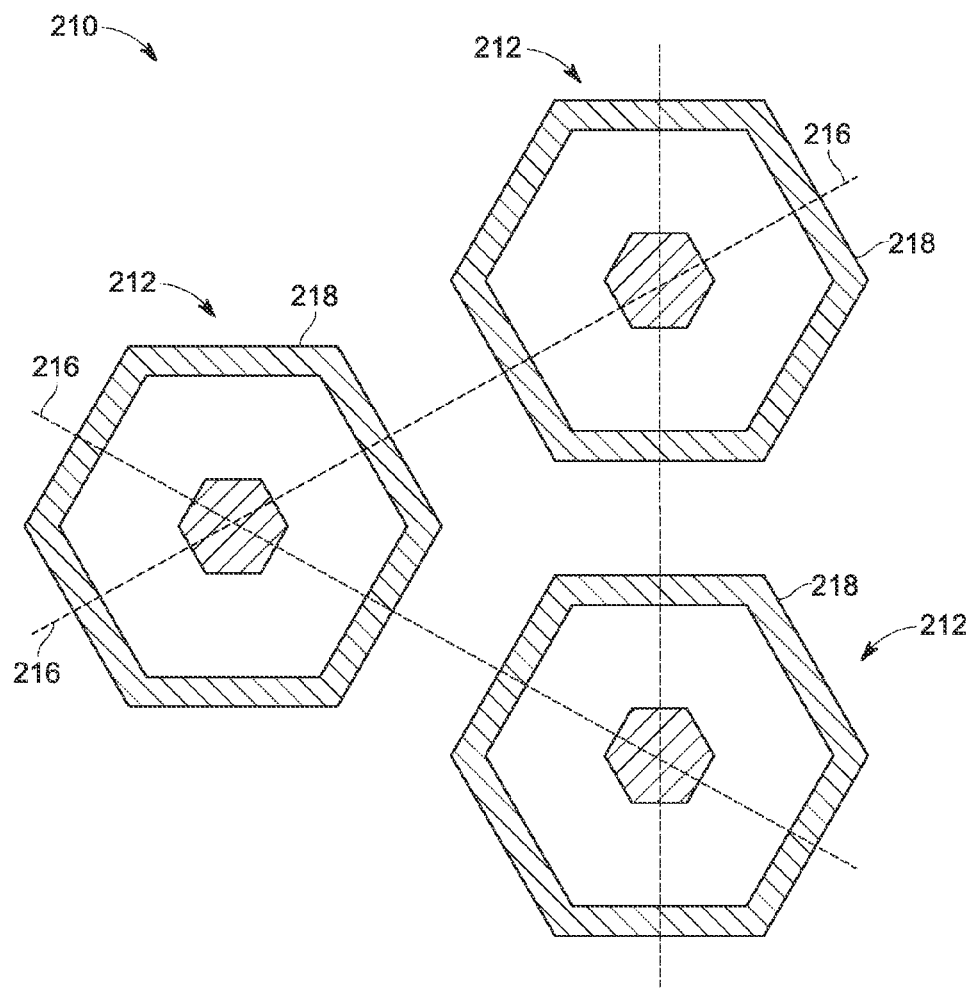
FIG. 13 is a diagram illustrating a honeycomb cellular device design, in accordance with an embodiment of the present approach.

It should also be appreciated that the approach set forth above is also applicable to cellular structures (e.g., triangular, square, honeycomb, and so forth). For example, FIG. 13 illustrates a top-down view of a hexagonal cellular design 210, which includes an example of MOSFET active areas 212. During fabrication of the illustrated MOSFET devices 212 identical trench features (indicated by the lines 216) fabricated simultaneously such that each trench oriented is perpendicularly to channel periphery. The number of trenches per cell side depends on cell size and trench pitch.

Technical effects of the present approach include reducing device resistance in semiconductor devices (e.g., MOSFETs, IGBTs, and other suitable semiconductor devices). Present embodiments include non-planar semiconductor devices (e.g., SiC devices) that provide increased surface area per device and increased channel width (e.g., increased channel periphery), which enables the production of lower resistance SiC devices. The disclosed device embodiments provide an increased effective surface area per die area that, in addition to reducing channel resistance, may decrease one or more contact resistances by increasing contact area at interfaces in the SiC device structure. Further, this approach is also applicable to cellular SiC device designs, such as honeycomb structures, to improve channel conduction and/or reduce on-state resistance.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor device, comprising:
a drift layer disposed on a substrate, wherein the drift layer comprises a non-planar surface comprising a plurality of repeating features oriented parallel to a length of a channel of the semiconductor device, and wherein each of the repeating features has dopant concentration higher than a remainder of the drift layer, wherein at least one of a plurality of dimensions of the device is selected and utilized to achieve a depth of the plurality of repeating features extending into the drift layer, wherein the depth reduces an on-state resistance of the device without impeding a blocking voltage of the device, further wherein the plurality of dimensions comprises: an amplitude of a profile of the device, a pitch of the profile of the device, an angle of the profile of the device and a thickness of the drift layer.

2. The device of claim 1, further comprising a non-planar well region disposed conformally along a portion of the non-planar surface of the drift layer.

3. The device of claim 2, wherein a height of each of the plurality of repeating features is less than or equal to approximately 10% of the thickness of the drift layer.

4. The device of claim 2, further comprising a non-planar source contact disposed conformally over at least a portion of the non-planar well region.

5. The device of claim 2, further comprising a second non-planar well region disposed conformally along a second portion of the non-planar surface of the drift layer, and comprising a non-planar drain contact disposed conformally over at least a portion of the second non-planar well region.

6. The device of claim 2, further comprising a non-planar dielectric layer disposed conformally over at least a portion of the drift layer and a portion of the well region and a non-planar gate disposed conformally over at least a portion of the non-planar dielectric layer.

7. The device of claim 1, wherein the drift layer comprises a silicon carbide (SiC) drift layer.

8. The device of claim 1, wherein the repeating features comprise repeating triangular peak features.

9. The device of claim 8, wherein the repeating triangular peak features provide an increase in a width of the channel equal to approximately 2a/b, wherein a is a length of a side of the repeating triangular peak features, and wherein b is a length of a base of the repeating triangular peak features or a pitch of the repeating triangular peak features.

10. The device of claim 1, wherein the repeating features comprise repeating rectangular or trapezoidal peak features.

11. The device of claim 10, wherein the repeating rectangular peak features provide an increase in a width of the channel region equal to approximately (2a+b)/b, wherein a is a height of the repeating rectangular peak features, and wherein b is a pitch of the repeating rectangular peak features.

12. The device of claim 1, wherein the dopant concentration in the repeating features is less than or equal to approximately twice a critical charge of the drift layer divided by a width of the repeating features.

13. The device of claim 1, wherein the semiconductor device is a cellular semiconductor device having a triangular, square, or honeycomb cellular design.

14. A semiconductor device, comprising:
a drift layer having a thickness, wherein the drift layer comprises a non-planar surface having a plurality of trench features extending a depth into the drift layer, wherein the depth is less than or equal to approximately 10% of the thickness of the drift layer, wherein a portion of the drift layer disposed between each of the plurality of trench features has at least one of a plurality of dimensions of the device selected and utilized to achieve the depth, wherein the depth reduces an on-state resistance of the device without impeding a blocking voltage of the device, further wherein the plurality of dimensions comprises: an amplitude of a profile of the device, a pitch of the profile of the device, an angle of the profile of the device and the thickness of the drift layer;

a non-planar p-well region conformally disposed in at least a portion of the non-planar surface of the drift layer;

a non-planar n+ region conformally disposed in at least a portion of the non-planar p-well region;

a non-planar dielectric layer conformally disposed over at least a portion of the drift layer, a portion of the p-well region, and a portion of the n+ region; and a non-planar gate conformally disposed over at least a portion of the non-planar dielectric layer.

15. The device of claim 14, wherein a portion of the drift layer disposed between each of the plurality of trench features has a dopant concentration that is higher than a dopant concentration in a remainder of the drift layer and the dopant concentration is less than or equal to approximately twice a critical charge of the drift layer divided by a width of the plurality of trench features.

16. The device of claim 14, wherein the drift layer comprises a silicon (Si), silicon carbide (SiC), aluminum nitride (AlN), gallium nitride (GaN), gallium arsenide (GaAs), diamond (C), or germanium (Ge) drift layer.

* * * * *